(12) United States Patent
Borghoff

(10) Patent No.: US 9,024,433 B2
(45) Date of Patent: May 5, 2015

(54) POWER SEMICONDUCTOR MODULE SYSTEM WITH UNDERCUT CONNECTION

(71) Applicant: Infineon Technologies AG, Neubiberg (DE)

(72) Inventor: Georg Borghoff, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 32 days.

(21) Appl. No.: 13/778,604

(22) Filed: Feb. 27, 2013

(65) Prior Publication Data

US 2013/0221513 A1    Aug. 29, 2013

(30) Foreign Application Priority Data

Feb. 29, 2012    (DE) .......................... 10 2012 101 666

(51) Int. Cl.
*H01L 23/10*    (2006.01)
*H01L 23/36*    (2006.01)
*H01L 25/07*    (2006.01)

(52) U.S. Cl.
CPC .............. *H01L 23/36* (2013.01); *H01L 25/072* (2013.01); *H01L 2924/0002* (2013.01)

(58) Field of Classification Search
USPC ........................................................ 257/700
See application file for complete search history.

(56) References Cited

U.S. PATENT DOCUMENTS

| | | | | |
|---|---|---|---|---|
| 6,563,211 B2 * | 5/2003 | Fukada et al. | ................. | 257/706 |
| 7,190,070 B2 * | 3/2007 | Manz et al. | .................... | 257/723 |
| 8,237,260 B2 * | 8/2012 | Tschirbs | ........................ | 257/700 |
| 2002/0153532 A1 * | 10/2002 | Sonobe et al. | ................ | 257/150 |
| 2005/0093122 A9 * | 5/2005 | Manz et al. | .................... | 257/678 |
| 2013/0181228 A1 * | 7/2013 | Usui et al. | ........................ | 257/77 |

FOREIGN PATENT DOCUMENTS

DE    10316356 A1    11/2004
DE    102007007223 A1    9/2008

* cited by examiner

*Primary Examiner* — Bilkis Jahan
(74) *Attorney, Agent, or Firm* — Murphy, Bilak & Homiller, PLLC

(57) ABSTRACT

A semiconductor module system includes a first semiconductor module and a second semiconductor module. The first semiconductor module has a first housing and a first base plate. The second semiconductor module has a second housing and a second base plate. The first base plate includes a first fitting segment fitted with a semiconductor component, and a first adjustment segment separated from the first fitting segment. The first adjustment segment also has a first adjustment device. The second base plate has a second adjustment device. The first semiconductor module and the second semiconductor module are configured to be positioned relative to one another using the first adjustment device and the second adjustment device so as to form at least one undercut connection. The first fitting segment and the first adjustment segment are connected to the first housing in a captive manner even when the undercut connection is not formed.

16 Claims, 6 Drawing Sheets

FIG 12A1
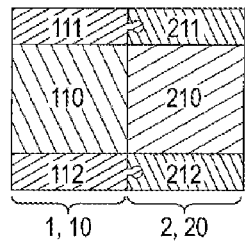
FIG 12A2
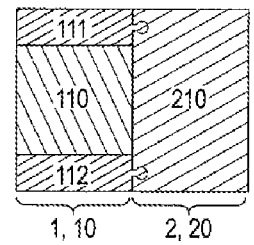
FIG 12B1
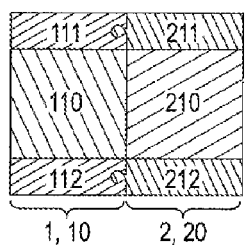
FIG 12B2
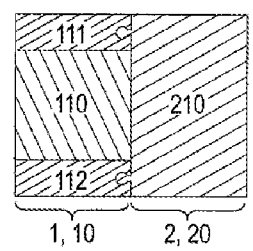
FIG 12C1
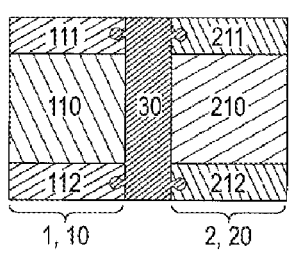
FIG 12C2
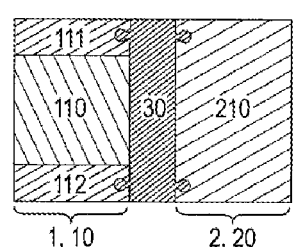
FIG 12D1
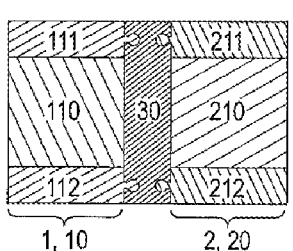
FIG 12D2
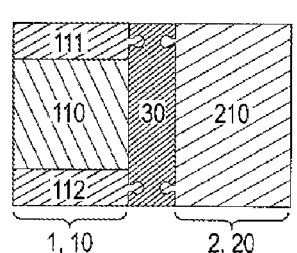
FIG 12E1
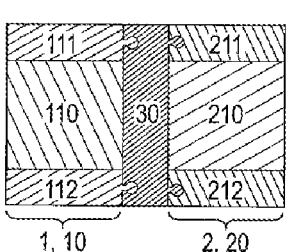
FIG 12E2
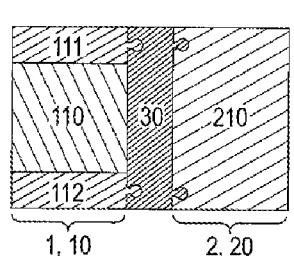

US 9,024,433 B2

POWER SEMICONDUCTOR MODULE SYSTEM WITH UNDERCUT CONNECTION

PRIORITY CLAIM

This application claims priority to German Patent Application No. 10 2012 101 666.6, filed on 29 Feb. 2012, the content of said German application incorporated herein by reference in its entirety.

BACKGROUND

When two or more semiconductor modules are intended to be mounted next to one another on a support, for example on a heat sink, it is often necessary for the modules to be positioned accurately relative to one another in the mounted state. This can be the case, for example, when the modules are intended to be connected to a common electrical connection element. When, specifically in the case of the connection element, the positions of the connections for the modules are fixedly predefined and the connection element is rigid or has only a slight degree of flexibility, it may not be possible to establish a connection to the connection conductor, and the modules may have to be reoriented, if the modules are not oriented sufficiently precisely relative to one another.

The cause of this problem is that the connection technique for connecting each of the modules to the heat sink requires certain tolerances. When semiconductor modules are provided, for example, with passage openings at which they can be screwed to a heat sink, the passage openings must have larger dimensions than the diameter of the screw, resulting in a certain degree of positional inaccuracy.

SUMMARY

Embodiments described herein provide an improved solution for positioning of two or more independent semiconductor modules in relation to one another.

A correspondingly improved semiconductor module system comprises a first semiconductor module and a second semiconductor module. The first semiconductor module has a first housing and a first base plate, and the second semiconductor module has a second housing and a second base plate. The first base plate is segmented and has a first fitting segment which is fitted with a semiconductor component, and also a first adjustment segment which is separated from the first fitting segment. In this context, "separated" means that the first fitting segment and the first adjustment segment are not sections of a single body which is formed from a uniform material.

The first semiconductor module and the second semiconductor module are formed such that they can be positioned relative to one another so as to form at least one undercut connection. In order to form this undercut connection, the first adjustment segment has a first adjustment device and the second base plate has a second adjustment device. In addition, the first fitting segment and the first adjustment segment are connected to the first housing in a captive manner, specifically even when there is no connection, in particular no undercut connection, between the first semiconductor module and the second semiconductor module.

Within the meaning of the present application, "undercut connection" is understood to mean a connection in which a projection, which has an undercut, from one element is inserted into a cutout in another element, with the result that an interlocking connection is produced between the first element and the second element.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings:

FIGS. 12A1-E2 show various examples of in each case two power semiconductor modules which are positioned relative to one another by undercut connections, in each case in horizontal sections through the base plates of the power semiconductor modules.

DETAILED DESCRIPTION

Figure 1:
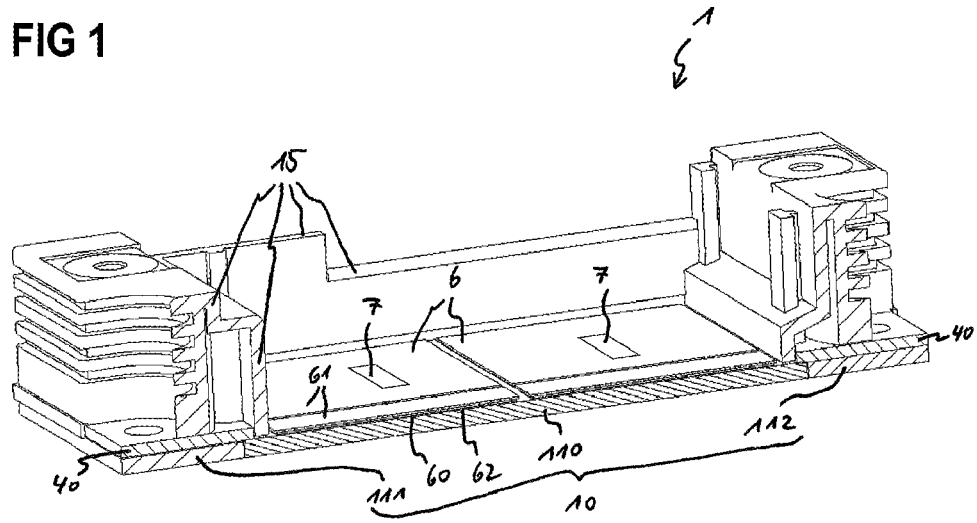
FIG. 1 shows a perspective sectional view of a power semiconductor module as can be used in a semiconductor module system according to an embodiment.

FIG. 1 shows a perspective sectional view of a first semiconductor module 1. The module comprises a housing 15 and a segmented base plate 10 having a fitting segment 110 and having two adjustment segments 111, 112. In principle, the first semiconductor module 1 has at least one adjustment segment 111, 112. The fitting segment 110 is a segment of the base plate 10, which segment is fitted with at least one semiconductor component 7. The at least one adjustment segment 111, 112 is an element which is separated from the fitting segment 110, that is to say the fitting segment 110 and the at least one adjustment segment 111, 112 are not constituent parts of a single body which is composed of a uniform material. In addition, the two different adjustment segments 111, 112 of the same semiconductor module 1 are likewise separated elements, that is to say they are not constituent parts of a single body which is composed of a uniform material. However, the fitting segment 110 and the at least one adjustment segment 111, 112 are connected to the housing 15 of the semiconductor module 1 in a captive manner. Any desired connecting technique, for example screwing, clamping, riveting, compression, latching etc. can be used to establish these connections. In addition, different connecting techniques can be employed in any desired combinations in the same semiconductor module 1.

The fitting element 110 is fitted with at least one semiconductor component 7. The semiconductor component 7 can be, for example, an IGBT, a MOSFET, a J-FET, a thyristor or a diode. Furthermore, one or more circuit mounts 6 can be provided, the semiconductor component or semiconductor components 7 being mounted on the circuit mount 6 and—if necessary for realizing the respective circuit—electrically interconnected.

The circuit mount 6 can be insulating substrates, for example, which have an insulation mount 60 which is in the form of a flat, plane-parallel plate which is provided with an upper metallization, which is patterned to form conductor tracks 61, on its upper side, that is to say on its side which is averted from the base plate 10. The insulation mount 60 can optionally be provided with a lower metallization 62 on its side which faces the base plate 10. The insulation mount 60 may be, for example, a ceramic plate, for example composed of aluminum oxide (Al2O3), aluminum nitride (AlN), zirconium oxide (ZrO2). The circuit mount 6 can be in the form of, for example, a DCB substrate (DCB=Direct Copper Bonding), a DAB substrate (DAB=Direct Aluminum Bonding) or an AMB substrate (AMB=Active Metal Brazing).

The housing 15 is in the form of a frame and is arranged above the base plate 10, with the result that the at least one semiconductor component 7 is located in the interior of the housing 15. The housing 15 can optionally also have a cover on that side of the frame which is averted from the base plate 10.

Further circuit elements, for example bonding wire connections, electrical connection lines, contact pins for making external electrical contact, a soft silicone-gel potting compound with which the interior space in the housing 15 from the base plate 1 to at least beyond the semiconductor components 7 is encapsulated, are not illustrated in FIG. 1 for reasons of clarity. Equally, one or more of the components can be present in the semiconductor module 1.

Figure 2:
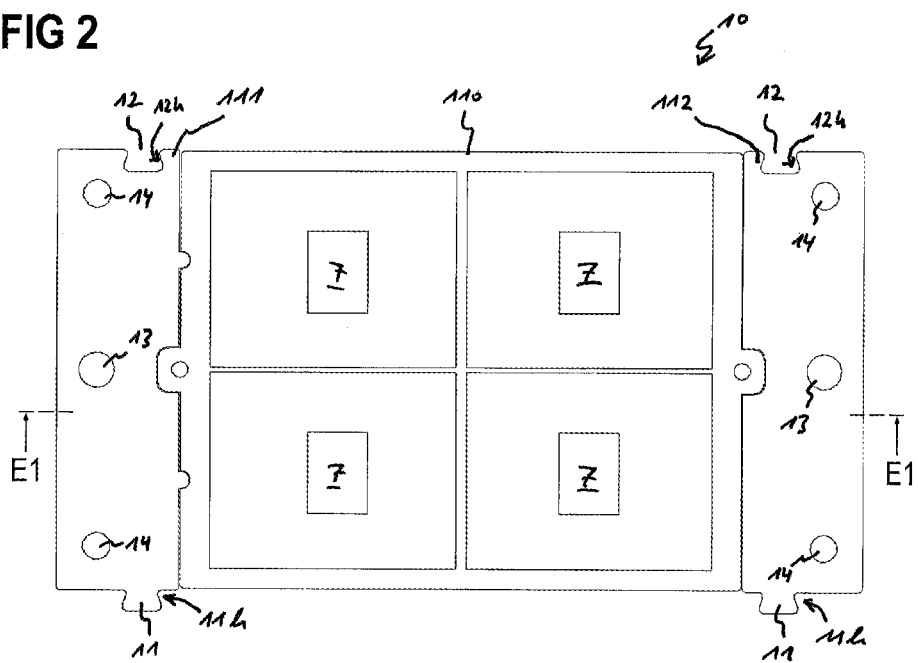
FIG. 2 shows a plan view of the base plate of the power semiconductor module according to FIG. 1.

FIG. 2 shows a plan view of the base plate 10 which is fitted with the circuit mounts 6 and the semiconductor components 7, as used in the semiconductor module 1 according to FIG. 1. The sectional plane E1 corresponds to the sectional view according to FIG. 1, wherein the housing 15 is additionally illustrated in FIG. 1, as are contact-pressure plates 40 which are explained below. The illustration clearly shows the segmentation of the base plate 10 into a fitting segment 110 and two adjustment segments 111, 112. The base plate segments 110, 111, 112 are individual elements which are independent of one another and which are situated only loosely next to one another. The fitting segment 110 is connected to the two adjustment segments 111, 112 by means of the housing 15, that is to say by both the fitting segment 110 and each of the adjustment segments 111, 112 are connected to the housing 15. This criterion equally applies to any other first semiconductor module 1 which comprises a fitting segment 110 and at least one adjustment segment 111, 112 which is separated from the fitting segment 110.

Each adjustment segment 111, 112 has at least one adjustment device 11, 12. An adjustment device 11, 12 can either be in the form of a projection 11 from the relevant adjustment segment 111, 112 or in the form of a cutout 12 in the relevant adjustment segment 111, 112. An undercut 11h or 12h is formed on each adjustment element 11, 12.

Since an adjustment segment 111, 112 can be used to establish an interlocking adjustment connection to another semiconductor module, each adjustment segment 111, 112 has at least one adjustment element 11, 12. In this case, identical or different adjustment elements 11, 12 can be combined with one another in any desired manner in an adjustment segment 111, 112, that is to say an adjustment segment 111, 112 can have exactly one projection 11, exactly one cutout 12, two or more projections 11, two or more cutouts 12, one projection 11 and one cutout 12, one projection 11 and two or more cutouts 12, one cutout 12 and two or more projections 11, etc.

The adjustment segment 111, 112 can optionally contain exactly one or more passage openings 13, for example passage holes, which can be used to screw the power semiconductor module 1, for example, to a heat sink. Similarly, the adjustment segment 111, 112 can have one or more passage openings 14, for example passage holes, which can be used to screw the relevant adjustment segment 111, 112 to the housing 15 of the semiconductor module 1, which housing 15 is shown in FIG. 1.

A semiconductor module system within the meaning of the present invention comprises two or more semiconductor modules, at least one of which, at least two of which, a plurality of which or all of which have a design of which the principle has been explained with reference to FIGS. 1 and 2. In this case, all the semiconductor modules of the semiconductor module system can optionally be of identical design. In the case of a semiconductor module system of this kind, all of the semiconductor modules can be mounted on a common support, for example a heat sink. To this end, the support advantageously has a flat mounting surface on which the individual semiconductor modules are arranged next to one another and are connected to the support. In this case, the individual semiconductor modules are oriented relative to one another by one or more undercut connections. Mounting can be performed such that two, several or all of the semiconductor modules of the semiconductor module system are positioned relative to one another with the aid of a sufficient number of undercut connections and are then connected to the support in the positioned state, for example by screwing.

When mounted on the support in the ready state, the base plates of all the modules of the semiconductor module system can be located next to one another within a plane-parallel layer, the thickness of the layer being indicated by the thickness of the thickest of all the base plates of the semiconductor module system. In this case, mounting can be performed such that the base plate of the semiconductor module system is not located entirely or partially between the base plate of one of the other modules of the semiconductor module system and the support in any of the modules of the semiconductor module system.

The positioning of two semiconductor modules 1, 2 so as to form at least one undercut connection will be explained below with reference to FIGS. 3 to 5. The respective housing of the semiconductor modules 1, 2 and the fitting of the circuit mount 6 are omitted in this case for reasons of clarity.

Figure 3:
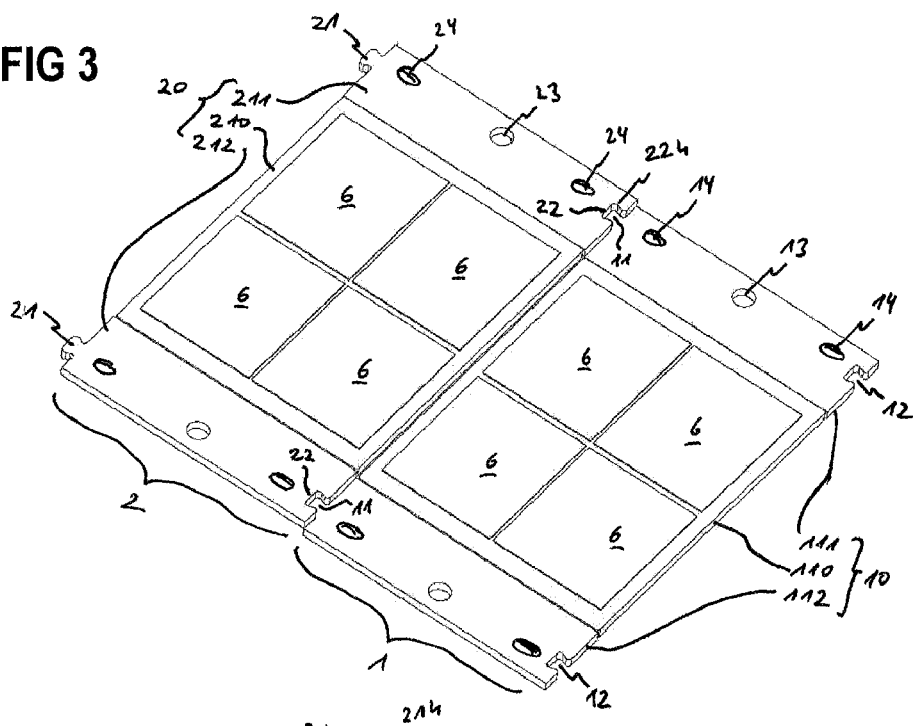
FIG. 3 shows a perspective plan view of the base plates of two power semiconductor modules as they are being positioned relative to one another.

FIG. 3 shows the base plates 10, 20 of the two semiconductor modules 1 and 2. The design of each of the base plates 10, 20 corresponds to the design explained in accordance with the base plate 10 according to FIGS. 1 and 2. Reference symbol 210 designates the fitting segment of the second base plate 20, and reference symbols 211, 212 designate the adjustment segments of the second base plate 20. The projections from the adjustment segments 211, 212 are identified by reference symbol 21 and the cutouts are identified by reference symbol 22. The projections 21 have undercuts 21h, and the cutouts 22 have undercuts 22h.

The relative adjustment of the semiconductor modules 1, 2 is performed by in each case one projection 11 from an adjustment segment 111, 112 being inserted into a cutout 22 in the second base plate 20 so as to form an undercut connection. FIG. 4 shows the semiconductor modules 1 and 2 which are adjusted relative to one another.

Figure 4:
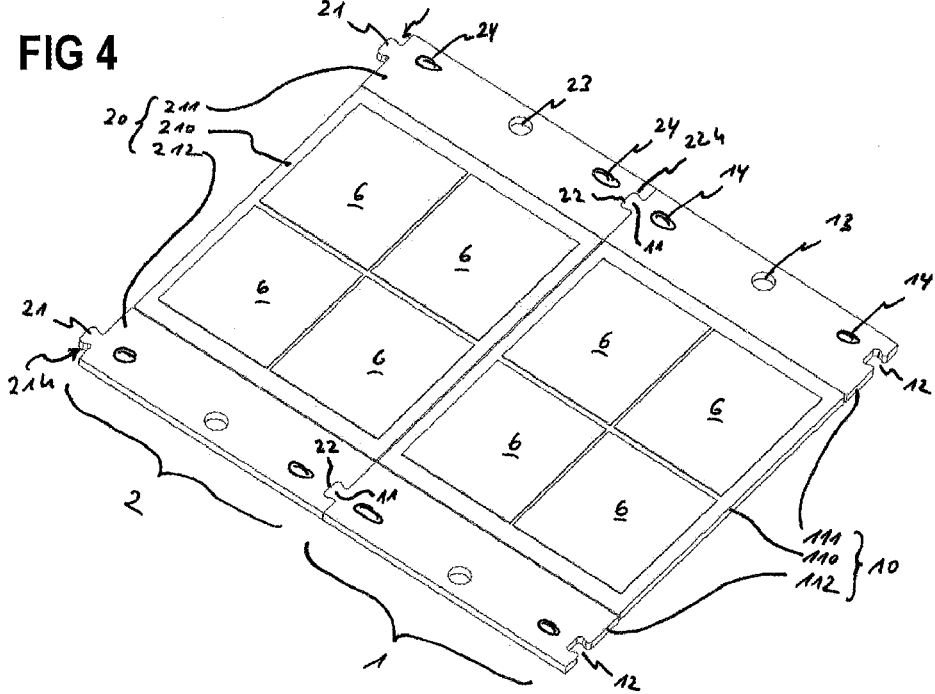
FIG. 4 shows the two base plates according to FIG. 3 after the undercut connection has been established.
Figure 5:
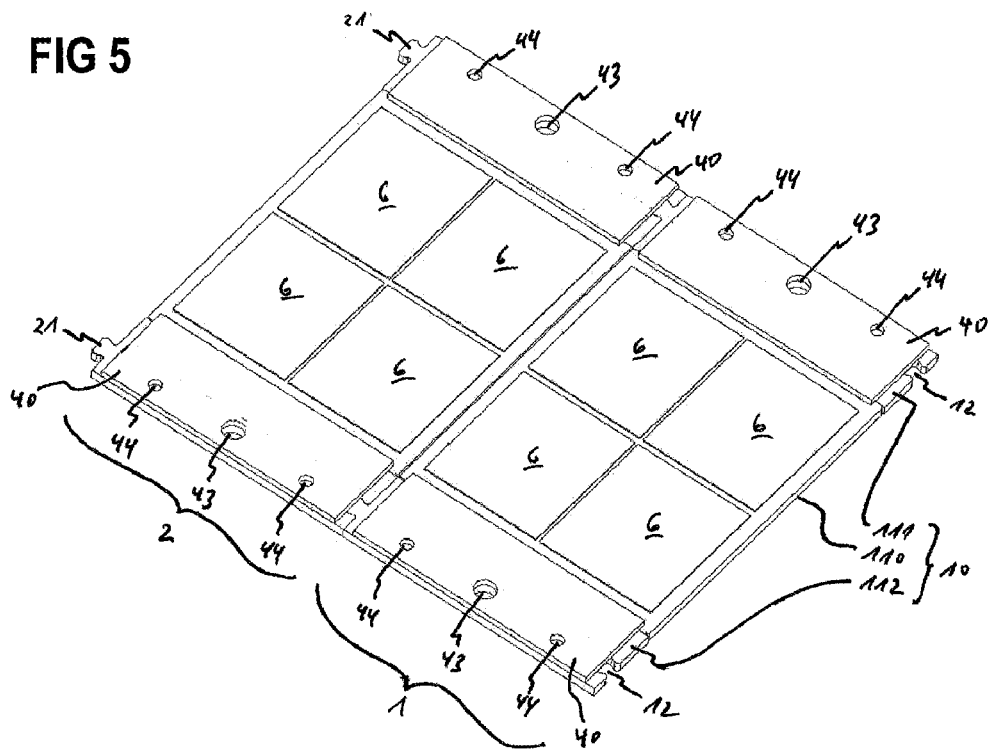
FIG. 5 shows the arrangement according to FIG. 4 after each adjustment segment has been provided with a contact-pressure plate.

The arrangement according to FIG. 5 corresponds to the arrangement according to FIG. 4, wherein optional contact-pressure plates 40 which are located above each adjustment segment 111, 112, 211, 212 are additionally illustrated. The contact-pressure plates 40 are used to distribute a contact-pressure onto the base plate 10, 20 located therebeneath when the respective contact-pressure plate 40 is screwed to the base plate located therebeneath with a support. In this case, the contact-pressure plate 40 can be slightly bent, with the result that it is pre-stressed when the screw is turned and the pre-stress acts on the base plate 10, 20 in a manner distributed over different points on the upper face of the base plate 10, 20, and exerts a contact-pressure force on the base plate 10, 20 in the direction of the support located therebeneath at the relevant points. In this case, the position of the screw is located at a point on the contact-pressure plate 40 which is at a distance from the base plate 10, 20 before the screw is turned.

If an adjustment element 111, 112, 211, 212 according to FIG. 4 has passage openings 13 or 23 for mounting the respective semiconductor module 1, 2 on a support, the respective contact-pressure plate 40 located thereabove can also have one or more corresponding passage openings 43 which are aligned with the passage opening 13 or 23 in the adjustment segment 111, 112 or 211, 212 situated therebeneath. The same applies for passage openings 14, the contact-pressure plates 40 which are located in each case above the relevant adjustment segment 111, 112, 211, 212 having passage openings 44 which are aligned with the passage openings 14.

Figure 6:
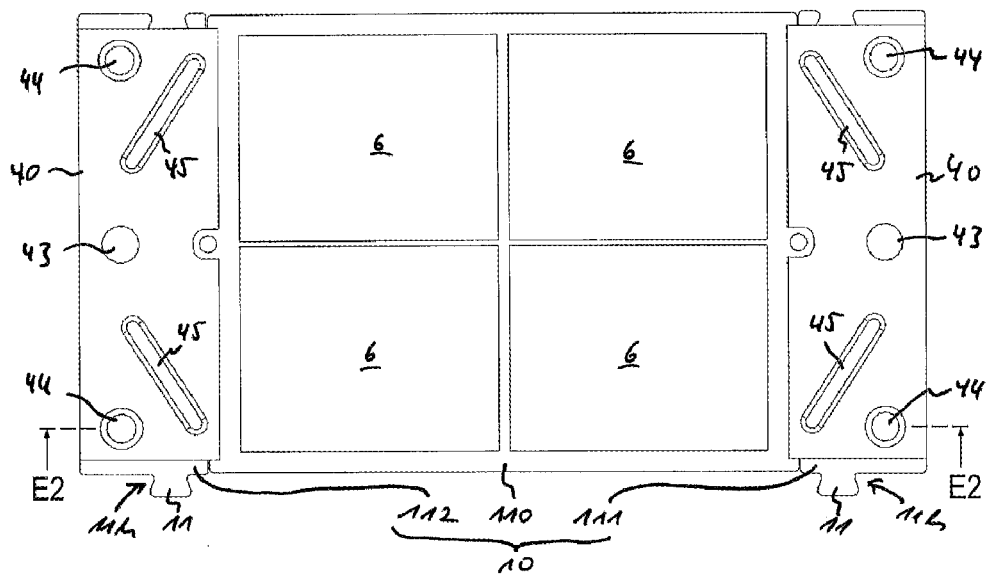
FIG. 6 shows a plan view of the base plate of a power semiconductor module in which each adjustment segment is provided with a contact-pressure plate.
Figure 7:
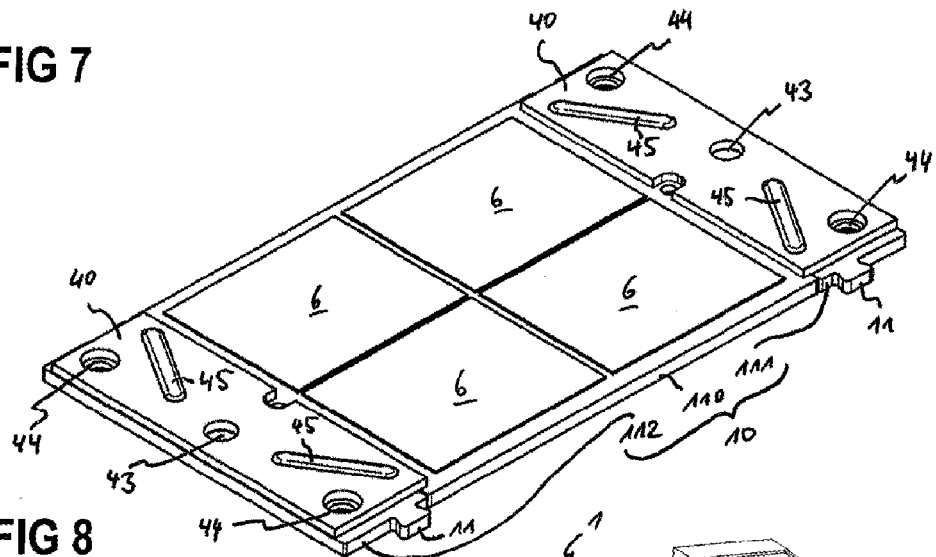
FIG. 7 shows a perspective view of the arrangement according to FIG. 6.

FIG. 6 corresponds to the arrangement according to FIG. 2, wherein a contact-pressure plate 40 with passage openings 43 or 44 is arranged above each adjustment segment 111, 112. As shown in FIG. 6, each contact-pressure plate 40 can have one or more embossed beads 45 which are used to mechanically stabilize the respective contact-pressure plate 40. FIG. 7 shows a perspective view of the arrangement according to FIG. 6.

Figure 8:
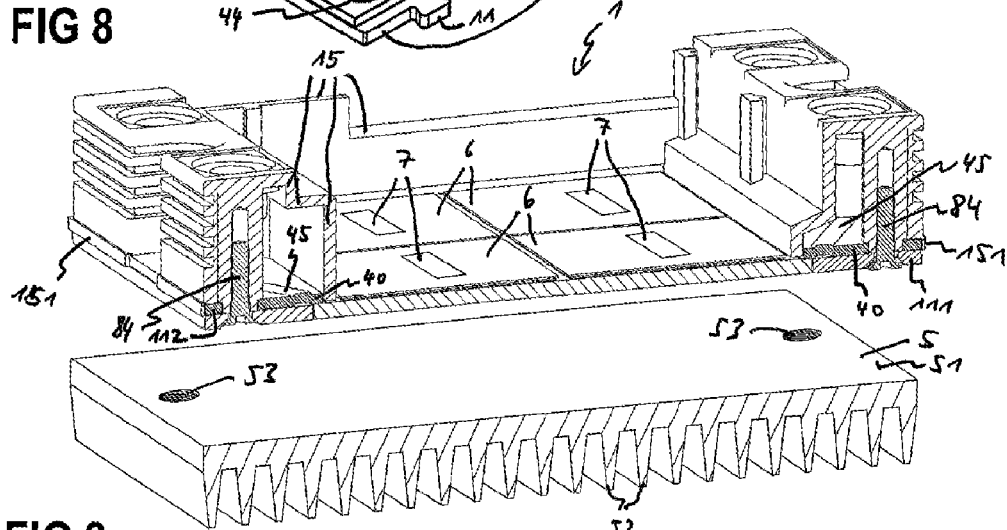
FIG. 8 shows a perspective sectional view of a power semiconductor module, which has a base plate designed according to FIGS. 6 and 7 and which is also provided with the contact-pressure plates illustrated in FIGS. 6 and 7, in a sectional plane E2 according to FIGS. 6 and 7.

FIG. 8 shows a semiconductor module 1 according to FIG. 1 which has a base plate 10 and also contact-pressure plates 40 as have been explained in accordance with FIGS. 6 and 7. A heat sink 5 is located beneath the semiconductor module 1. The heat sink 5 has a flat mounting surface 51 and threaded holes 53 which start from the mounting surface 51 extending into the heat sink 5. Each of these threaded holes 53 is aligned with one of the passage openings 13 of the base plate 10 (see FIGS. 2 to 4), and with one of the passage openings 43 of one of the contact-pressure plates 40 (see FIGS. 5 to 7), with the result that in each case one screw can be routed through passage openings 13 and 43 which are arranged in alignment and can be screwed to a threaded hole 53 and the base plate 10 is firmly mounted on the heat sink 5. However, a contact-pressure plate 40 can optionally also be dispensed with. In this case, the screw is only routed through the passage opening 13 and screwed to a threaded hole 53.

The view according to FIG. 8 also shows that the adjustment segments 111, 112 are screwed to the housing 15 by means of screws 84 which are routed though passage openings 14 in the relevant adjustment segment 111, 112 (see FIGS. 2, 3, 4) and also through the passage openings 44 in the relevant contact-pressure plate 40 (see FIGS. 5 to 7). As a result, the adjustment segments 111, 112 and also the contact-pressure plates 40 are connected to the housing 15 in a captive manner. In order to facilitate mounting of the contact-pressure plates 40, the housing 15 can have a spring-action latching means 151 for each contact-pressure plate 40, the latching means 151 laterally surrounding the contact-pressure plate 40, with the result that the contact-pressure plate 40 is mounted on the housing 15 in a captive manner even when the relevant screw 84 has not yet been inserted.

Whereas the adjustment segments 111, 112 are fastened to the housing 15 with the aid of the screws 84, the fitting segment 110 and the housing 15 can be connected, for example, by adhesive bonding. However, any other desired connecting techniques, for example screwing, can be used instead of or in addition to adhesive bonding.

In the exemplary embodiments described up to this point, a projection 11 from a first adjustment element 111, 112 of a first semiconductor module 1 was inserted directly into a cutout 22 in an adjustment segment of a second semiconductor module 2 so as to form an undercut connection.

Figure 9:
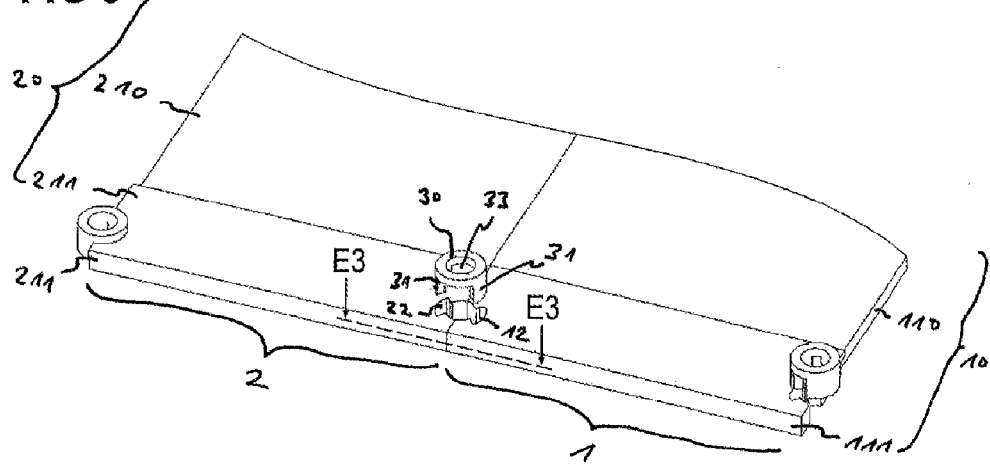
FIG. 9 shows the base plates, which are situated next to one another, of two power semiconductor modules as the power semiconductor modules are being positioned relative to one another with the aid of an undercut connection by means of a separate connecting element which can be screwed to a heat sink.

In contrast, in the arrangement according to FIG. 9, the semiconductor modules 1 and 2 are connected with the aid of a separate connecting element 30 which engages both into a cutout 12 in an adjustment segment 111 of a first semiconductor module 1 and into a cutout 22 in an adjustment segment 211 of a second semiconductor module 2 in each case so as to form an undercut connection.

FIG. 9 shows the arrangement immediately before the connecting element 30 is inserted into the cutouts 12 and 22. To this end, the connecting element 30 has projections 31 which are in each case provided with an undercut. The projections 31 are inserted into the cutouts 12 and 22, in each case so as to form an undercut connection.

Figure 10A:
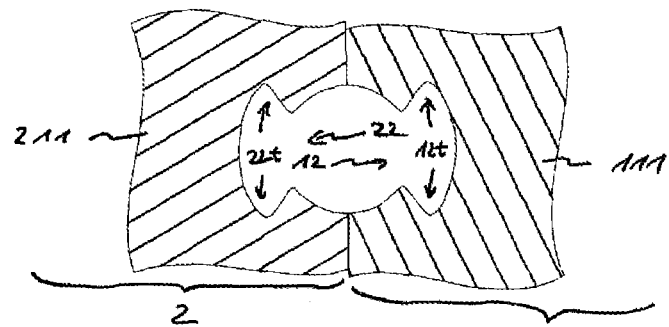
FIG. 10A shows a horizontal section through the connecting point, which is illustrated in FIG. 9, before the connecting element is inserted in a sectional plane E3 which is illustrated in FIG. 9.
Figure 10B:
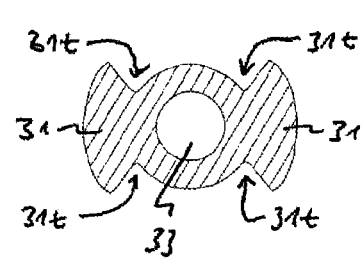
FIG. 10B shows a horizontal section through the connecting element which is illustrated in FIG. 9.
Figure 10C:
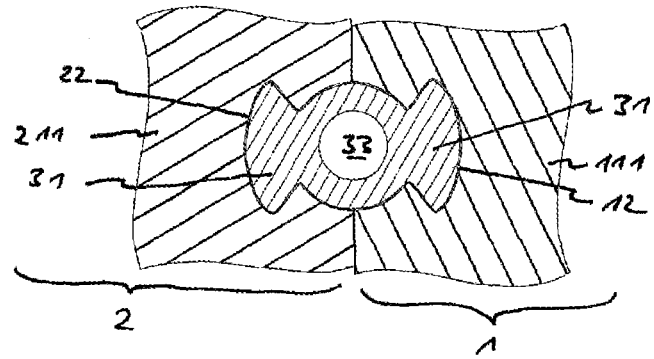
FIG. 10C shows a horizontal section through the connecting point, which is illustrated in FIG. 9, when the connecting element is inserted.

The connecting element 30 can optionally have a passage opening 33 which can be used to screw the connecting element 30 to a heat sink with the aid of a screw, the heat sink being arranged on that lower face of the base plates 10, 20 which is averted from the connecting element 30 in the arrangement according to FIG. 9. The connecting element 30 and the adjustment segments 111, 211 are screwed to the heat sink by a screwing means of this kind, wherein the adjustment element 30 exerts a contact pressure on the adjustment segments 111, 211 and, in the process, connects the semiconductor modules 1 and 2 to the heat sink. FIG. 10A shows a sectional view of an enlarged section of the connecting region illustrated in FIG. 9 in a sectional plane E3, FIG. 10B shows a sectional view of the connecting element 30, and FIG. 10C shows the sectional view according to FIG. 10A, but with the connecting element 30 fully inserted.

Figure 11:
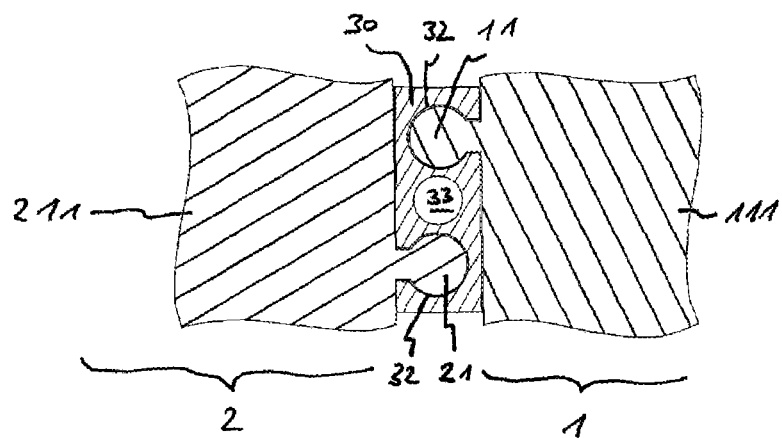
FIG. 11 shows a horizontal section through a connecting point between two semiconductor modules, the base plates of the semiconductor modules each having a projection and the semiconductor modules being positioned relative to one another by means of a separate connecting element so as to form two undercut connections.

As an alternative to two projections 31, a connecting element 30 could also have two convex portions 32 into which in each case one projection 11 or 12, which is provided with an undercut, from a first semiconductor module 1 or a second semiconductor module 2 engages so as to form undercut connections, this being shown as a result in FIG. 11.

FIG. 12 shows schematically different options with which two semiconductor modules 1, 2 can be positioned relative to one another in a defined manner so as to form an undercut connection. The fitting of the respective fitting segments 110 and 210 is illustrated in as little detail as the individual housing of the semiconductor modules 1, 2. In all the variants of a semiconductor module system according to the invention, the semiconductor modules 1, 2 of the semiconductor module system can in each case have a separate housing, that is to say a housing in which only the semiconductor component or semiconductor components 7 of the semiconductor module 1, 2 are arranged, but not the semiconductor components 7 of one of the other semiconductor modules 2, 1.

In subfigures 12A1 to 12E1, each of the first semiconductor modules 1 has at least one adjustment segment 111, 112 which represents an element which is independent of the first fitting segment 110 of the first base plate 10. Accordingly, in subfigures 12A1 to 12E1, the base plate 20 of the second semiconductor module 2 has in each case at least one adjustment segment 211, 212 which forms an element which is separated from the first fitting segment 210 of the second base plate.

Subfigures 12A2, 12B2, 12C2, 12D2, 12E2 correspond, in said order, to the arrangements according to subfigures 12A1, 12B1, 12C1, 12D1 and 12E1, with the difference that an undercut connection is used to establish an adjustment connection between the first semiconductor module 1 and the second semiconductor module 2, the adjustment device 21, 22 of the second base plate 20 not being located on an adjustment segment which is separated from the fitting segment 210 but on the fitting segment 210 itself in the case of the undercut connection. Accordingly, a base plate 20 according to subfigures 12A2 to 12E2 can be integrally formed, whereas the base plate 10 of the first semiconductor module 1 has at least one adjustment segment 111, 112 which is separated from the fitting segment of the base plate 10.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor module system, comprising:
   a first semiconductor module having a first housing and a first base plate, the first base plate having a first fitting segment fitted with a semiconductor component and a first adjustment segment separated from the first fitting segment, the first adjustment segment having a first adjustment device; and
   a second semiconductor module having a second housing and a second base plate, the second base plate having a second adjustment device,
   wherein the first semiconductor module and the second semiconductor module are configured to be positioned relative to one another using the first adjustment device and the second adjustment device so as to form at least one undercut connection,
   wherein the first fitting segment and the first adjustment segment are connected to the first housing in a captive manner even when the undercut connection is not formed,
   wherein the first adjustment device comprises a projection of the first adjustment segment and has an undercut,
   wherein the second adjustment device comprises a cutout in the second base plate, and
   wherein the first adjustment device is configured to be inserted in the cutout so as to form the undercut connection.

2. The semiconductor module system as claimed in claim 1, further comprising a connecting element, wherein the second adjustment device comprises a projection from the second base plate, and wherein the connecting element has a first cutout into which the first adjustment device is configured to be inserted and a second cutout into which the second adjustment device is configured to be inserted so as to form the undercut connection.

3. The semiconductor module system as claimed in claim 1, further comprising a contact-pressure plate arranged between the first adjustment segment and the first housing and connected to the first housing in a captive manner even when the undercut connection is not formed, wherein the contact-pressure plate has a passage opening configured to receive a first screw for screwing the contact-pressure plate to a heat sink such that the first adjustment segment is pressed against the heat sink by the contact-pressure plate.

4. The semiconductor module system as claimed in claim 1, wherein the second base plate has a second fitting segment fitted with a second semiconductor component, and a second adjustment segment separated from the second fitting segment.

5. The semiconductor module system as claimed in claim 1, further comprising:
   a heat sink having a contact area, the first semiconductor module and the second semiconductor module being arranged next to one another on the contact area and connected to the heat sink; and
   a continuous adjustment connection established between the first adjustment segment and the second base plate, the adjustment connection being formed by at least one undercut connection.

6. The semiconductor module system as claimed in claim 1, further comprising a connecting element, and wherein the connecting element has a cutout into which the first adjustment device is configured to be inserted and a projection having an undercut configured to be inserted into the second adjustment device so as to form the undercut connection.

7. The semiconductor module system as claimed in claim 6, wherein the connecting element has a first passage opening configured to receive a first screw for screwing the connecting element to a heat sink such that both the first adjustment segment and the second base plate are pressed against the heat sink by the connecting element.

8. A semiconductor module system, comprising:
a first semiconductor module having a first housing and a first base plate, the first base plate having a first fitting segment fitted with a semiconductor component and a first adjustment segment separated from the first fitting segment, the first adjustment segment having a first adjustment device; and
a second semiconductor module having a second housing and a second base plate, the second base plate having a second adjustment device,
wherein the first semiconductor module and the second semiconductor module are configured to be positioned relative to one another using the first adjustment device and the second adjustment device so as to form at least one undercut connection,
wherein the first fitting segment and the first adjustment segment are connected to the first housing in a captive manner even when the undercut connection is not formed,
wherein the first adjustment device comprises a cutout in the first adjustment segment,
wherein the second adjustment device comprises a projection from the second base plate, the projection having an undercut, and
wherein the projection is configured to be inserted in the first adjustment device so as to form the undercut connection.

9. The semiconductor module system as claimed in claim 8, further comprising a contact-pressure plate arranged between the first adjustment segment and the first housing and connected to the first housing in a captive manner even when the undercut connection is not formed, wherein the contact-pressure plate has a passage opening configured to receive a first screw for screwing the contact-pressure plate to a heat sink such that the first adjustment segment is pressed against the heat sink by the contact-pressure plate.

10. The semiconductor module system as claimed in claim 8, wherein the second base plate has a second fitting segment fitted with a second semiconductor component, and a second adjustment segment separated from the second fitting segment.

11. The semiconductor module system as claimed in claim 8, further comprising:
a heat sink having a contact area, the first semiconductor module and the second semiconductor module being arranged next to one another on the contact area and connected to the heat sink; and
a continuous adjustment connection established between the first adjustment segment and the second base plate, the adjustment connection being formed by at least one undercut connection.

12. The semiconductor module system as claimed in claim 8, further comprising a connecting element, and wherein the connecting element has a first projection having an undercut configured to be inserted into the first adjustment device and a second projection having an undercut configured to be inserted into the second adjustment device so as to form the undercut connection.

13. The semiconductor module system as claimed in claim 12, wherein the connecting element has a first passage opening configured to receive a first screw for screwing the connecting element to a heat sink such that both the first adjustment segment and the second base plate are pressed against the heat sink by the connecting element.

14. The semiconductor module system as claimed in claim 8, further comprising a connecting element, and wherein the connecting element has a projection having an undercut configured to be inserted into the first adjustment device and a cutout into which the second adjustment device is configured to be inserted so as to form the undercut connection.

15. The semiconductor module system as claimed in claim 14, wherein the connecting element has a first passage opening configured to receive a first screw for screwing the connecting element to a heat sink such that both the first adjustment segment and the second base plate are pressed against the heat sink by the connecting element.

16. A semiconductor module system, comprising:
a first semiconductor module having a first housing and a first base plate, the first base plate having a first fitting segment fitted with a semiconductor component and a first adjustment segment separated from the first fitting segment, the first adjustment segment having a first adjustment device; and
a second semiconductor module having a second housing and a second base plate, the second base plate having a second adjustment device,
wherein the first semiconductor module and the second semiconductor module are configured to be positioned relative to one another using the first adjustment device and the second adjustment device so as to form at least one undercut connection,
wherein the first fitting segment and the first adjustment segment are connected to the first housing in a captive manner even when the undercut connection is not formed,
the semiconductor module system further comprising a contact-pressure plate arranged between the first adjustment segment and the first housing and connected to the first housing in a captive manner even when the undercut connection is not formed, and
wherein the contact-pressure plate has a passage opening configured to receive a first screw for screwing the contact-pressure plate to a heat sink such that the first adjustment segment is pressed against the heat sink by the contact-pressure plate.

* * * * *